US009806256B1

(12) United States Patent
Wu et al.

(10) Patent No.: US 9,806,256 B1
(45) Date of Patent: Oct. 31, 2017

(54) RESISTIVE MEMORY DEVICE HAVING SIDEWALL SPACER ELECTRODE AND METHOD OF MAKING THEREOF

(71) Applicant: SANDISK TECHNOLOGIES LLC, Plano, TX (US)

(72) Inventors: Ming-Che Wu, San Jose, CA (US); Chuanbin Pan, San Jose, CA (US); Guangle Zhou, Fremont, CA (US); Tanmay Kumar, Pleasanton, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/299,919

(22) Filed: Oct. 21, 2016

(51) Int. Cl.
*H01L 45/00* (2006.01)
*G11C 13/00* (2006.01)

(52) U.S. Cl.
CPC .......... *H01L 45/124* (2013.01); *G11C 13/004* (2013.01); *G11C 13/0007* (2013.01); *G11C 13/0026* (2013.01); *G11C 13/0028* (2013.01); *G11C 13/0069* (2013.01); *G11C 13/0097* (2013.01); *H01L 45/085* (2013.01); *H01L 45/1246* (2013.01); *H01L 45/1266* (2013.01); *H01L 45/146* (2013.01); *H01L 45/1675* (2013.01)

(58) Field of Classification Search
CPC ............ G11C 13/0007; G11C 11/5685; H01L 45/145–45/147; H01L 45/16–45/1691; H01L 45/124; H01L 45/1675
See application file for complete search history.

(56) References Cited

U.S. PATENT DOCUMENTS

| 4,646,266 | A | 2/1987 | Ovshinsky et al. |
|---|---|---|---|
| 4,665,428 | A | 5/1987 | Hockley et al. |
| 5,166,760 | A | 11/1992 | Mori |
| 5,432,729 | A | 7/1995 | Carson et al. |
| 5,559,732 | A | 9/1996 | Birge |
| 5,693,556 | A | 12/1997 | Cleeves |
| 5,745,407 | A | 4/1998 | Levy et al. |
| 5,751,012 | A | 5/1998 | Wolstenholme et al. |
| 5,835,396 | A | 11/1998 | Zhang |
| 5,915,167 | A | 6/1999 | Leedy |
| 5,962,911 | A | 10/1999 | Manley |
| 5,991,193 | A | 11/1999 | Gallagher et al. |

(Continued)

FOREIGN PATENT DOCUMENTS

WO   WO2007-004843 A1   1/2007

OTHER PUBLICATIONS

Govoreanu, et al., Vacancy-Modulated Conductive Oxide Resistive RAM (VMCO-RRAM): An Area-ScAlable Switching Current, Self Compliant, Highly Nonlinear and Wide On/Off-Window Resistive Switching Cell, IEDM13, 2013, pp. 256-259, Leuven-Belgium.

(Continued)

*Primary Examiner* — Evan Pert
*Assistant Examiner* — Changhyun Yi
(74) *Attorney, Agent, or Firm* — The Marbury Law Group PLLC

(57) ABSTRACT

A resistive memory device includes a first electrode, a sidewall spacer electrode located on a sidewall of a dielectric material contacting the first electrode, a resistive memory cell containing a resistive memory material and contacting the sidewall spacer electrode, and a second electrode containing the resistive memory cell.

19 Claims, 14 Drawing Sheets

(56) References Cited

U.S. PATENT DOCUMENTS

| | | | |
|---|---|---|---|
| 6,014,330 A | 1/2000 | Endoh et al. | |
| 6,034,882 A | 3/2000 | Johnson et al. | |
| 6,055,180 A | 4/2000 | Gudesen et al. | |
| 6,111,784 A | 8/2000 | Nishimura et al. | |
| 6,187,617 B1 | 2/2001 | Gauthier et al. | |
| 6,236,587 B1 | 5/2001 | Gudesen et al. | |
| 6,306,718 B1 | 10/2001 | Singh et al. | |
| 6,420,215 B1 | 7/2002 | Knall et al. | |
| 6,483,736 B2 | 11/2002 | Johnson et al. | |
| 6,486,065 B2 | 11/2002 | Vyvoda et al. | |
| 6,525,953 B1 | 2/2003 | Johnson | |
| 6,541,312 B2 | 4/2003 | Cleeves et al. | |
| 6,548,313 B1 | 4/2003 | Ravi et al. | |
| 6,567,301 B2 | 5/2003 | Anthony et al. | |
| 6,584,029 B2 | 6/2003 | Tran et al. | |
| 6,677,220 B2 | 1/2004 | Van Brocklin et al. | |
| 6,686,646 B2 | 2/2004 | Lee | |
| 6,693,823 B2 | 2/2004 | Brown | |
| 6,706,402 B2 | 3/2004 | Rueckes et al. | |
| 6,777,773 B2 | 8/2004 | Knall | |
| 6,834,008 B2 | 12/2004 | Rinerson et al. | |
| 6,847,544 B1 | 1/2005 | Smith et al. | |
| 6,853,049 B2 | 2/2005 | Herner | |
| 6,873,543 B2 | 3/2005 | Smith et al. | |
| 6,879,508 B2 | 4/2005 | Tran | |
| 6,881,994 B2 | 4/2005 | Lee et al. | |
| 6,946,719 B2 | 9/2005 | Petti et al. | |
| 6,951,780 B1 | 10/2005 | Herner | |
| 6,952,030 B2 | 10/2005 | Herner et al. | |
| 6,952,043 B2 | 10/2005 | Vyvoda et al. | |
| 6,999,366 B2 | 2/2006 | Perner et al. | |
| 7,038,248 B2 | 5/2006 | Lee | |
| 7,071,008 B2 | 7/2006 | Rinerson et al. | |
| 7,081,377 B2 | 7/2006 | Cleeves | |
| 7,126,855 B2 | 10/2006 | Honda et al. | |
| 7,172,840 B2 | 2/2007 | Chen | |
| 7,176,064 B2 | 2/2007 | Herner | |
| 7,180,815 B2 | 2/2007 | Fujiu et al. | |
| 7,224,013 B2 | 5/2007 | Herner et al. | |
| 7,283,403 B2 | 10/2007 | Johnson | |
| 7,307,013 B2 | 12/2007 | Raghuram et al. | |
| 7,474,000 B2 | 1/2009 | Scheuerlein et al. | |
| 7,511,352 B2 | 3/2009 | Vyvoda | |
| 7,575,984 B2 | 8/2009 | Radigan et al. | |
| 7,701,746 B2 | 4/2010 | Meeks et al. | |
| 7,800,934 B2 | 9/2010 | Kumar et al. | |
| 7,812,335 B2 | 10/2010 | Scheuerlein | |
| 9,343,507 B2 | 5/2016 | Takaki | |
| 9,437,658 B2 | 9/2016 | Sakotsubo | |
| 2004/0016991 A1 | 1/2004 | Johnson et al. | |
| 2004/0228159 A1 | 11/2004 | Kostylev et al. | |
| 2004/0232509 A1 | 11/2004 | Vyvoda | |
| 2005/0052915 A1 | 3/2005 | Herner et al. | |
| 2005/0098800 A1 | 5/2005 | Herner et al. | |
| 2005/0121742 A1 | 6/2005 | Petti et al. | |
| 2005/0221200 A1 | 10/2005 | Chen | |
| 2005/0226067 A1 | 10/2005 | Herner et al. | |
| 2006/0087005 A1 | 4/2006 | Herner | |
| 2006/0250836 A1 | 11/2006 | Herner et al. | |
| 2006/0250837 A1 | 11/2006 | Herner et al. | |
| 2007/0111429 A1 | 5/2007 | Lung | |
| 2007/0164309 A1 | 7/2007 | Kumar et al. | |
| 2009/0256129 A1 | 10/2009 | Scheuerlein | |
| 2009/0257265 A1 | 10/2009 | Chen et al. | |
| 2009/0257266 A1 | 10/2009 | Chen et al. | |
| 2009/0258489 A1 | 10/2009 | Chen et al. | |
| 2013/0043455 A1 | 2/2013 | Bateman | |
| 2015/0069316 A1* | 3/2015 | Lee | H01L 45/1683 257/4 |
| 2015/0263069 A1 | 9/2015 | Jo | |
| 2016/0043143 A1 | 2/2016 | Sakotsubo | |

OTHER PUBLICATIONS

Jo, S.H. et al., "Cross-Point Resistive RAM Based on Field-Assisted Superlinear Threshold Selector", IEEE Transactions on Electron Devices, vol. 62 No. 11, Nov. 2015, pp. 3477-3481.

Zhang, L., "Study of the Selector Element for Resistive Memory", Ku Leuven Arenberg Doctor School—Faculty of Engineering of Science, Oct. 2015, pp. 232, Haverly-Belgium.

U.S. Appl. No. 15/157,945, filed May 18, 2016, SanDisk Technologies LLC.

U.S. Appl. No. 15/228,216, filed Aug. 4, 2016, SanDisk Technologies LLC.

U.S. Appl. No. 15/251,818, filed Aug. 30, 2016, SanDisk Technologies LLC.

* cited by examiner

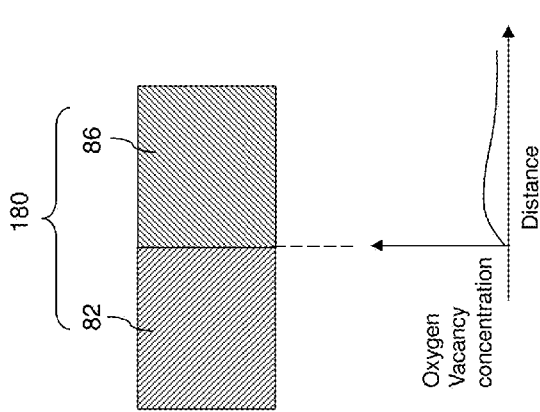
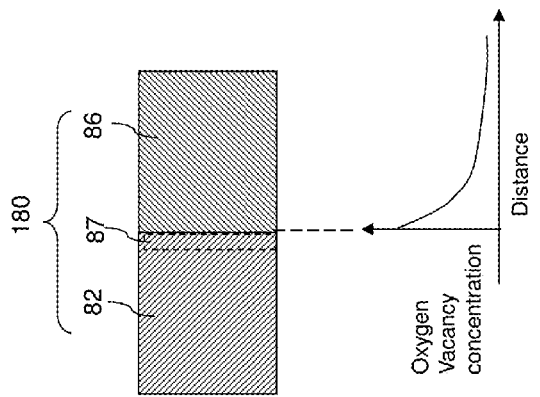

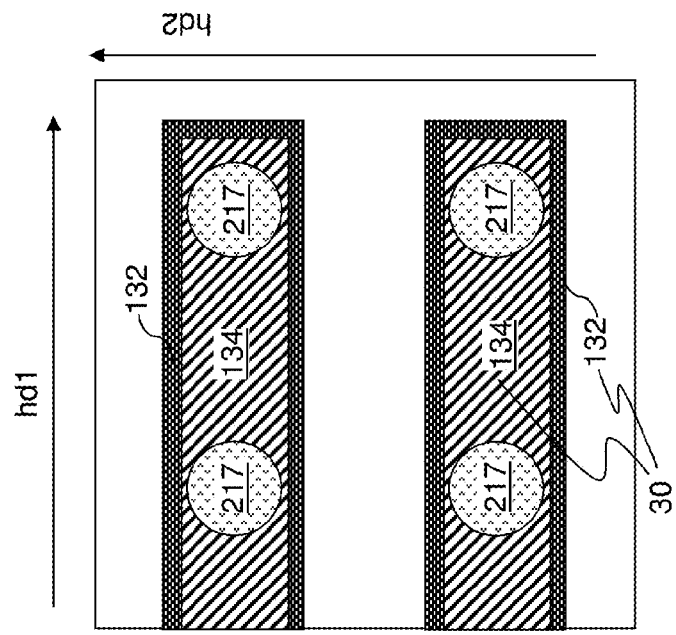
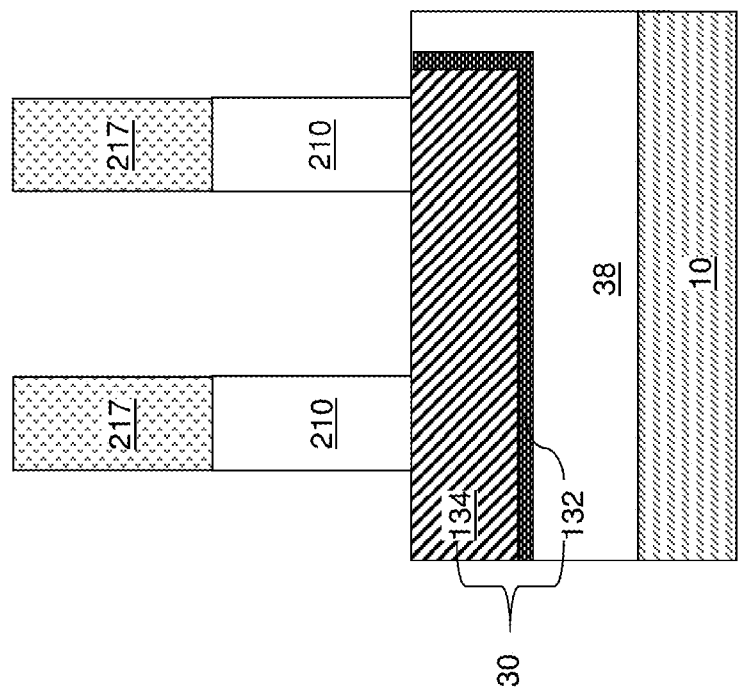
FIG. 4B
FIG. 4A

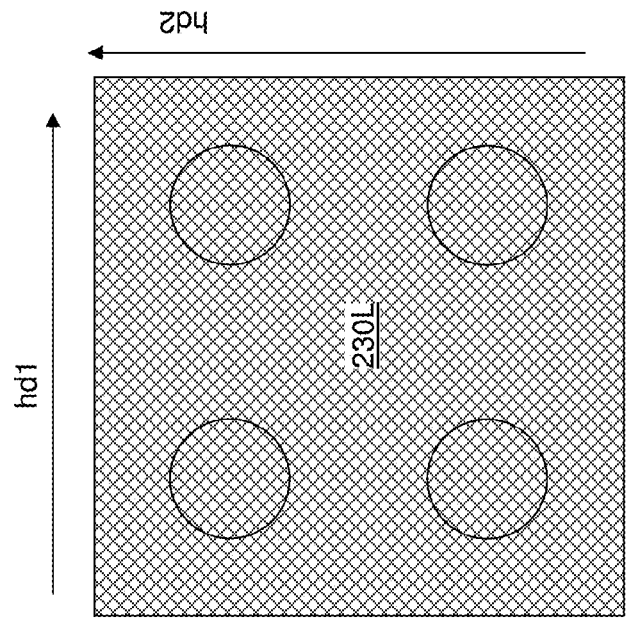
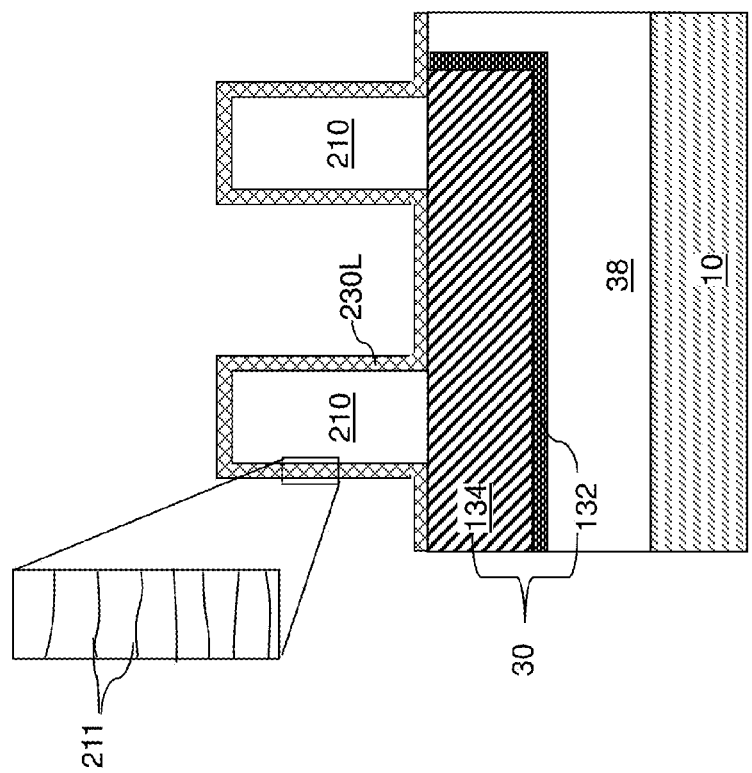
FIG. 5B
FIG. 5A

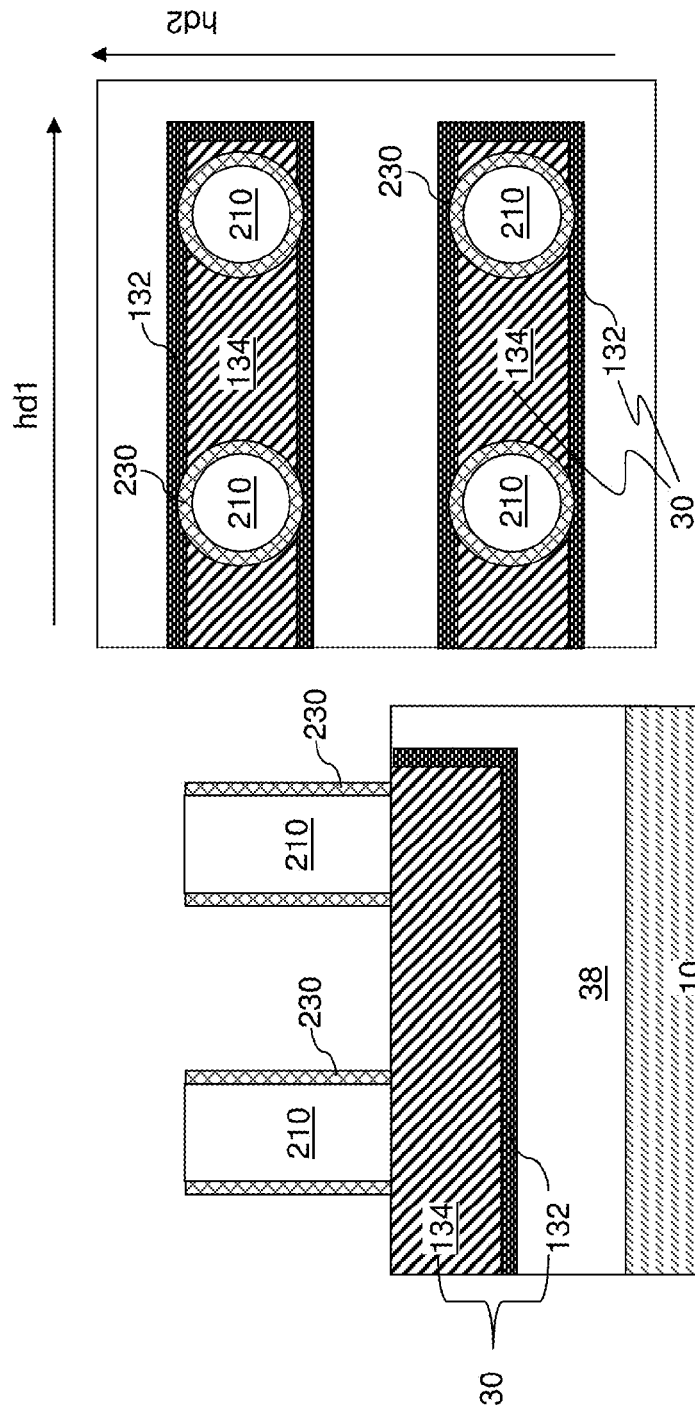

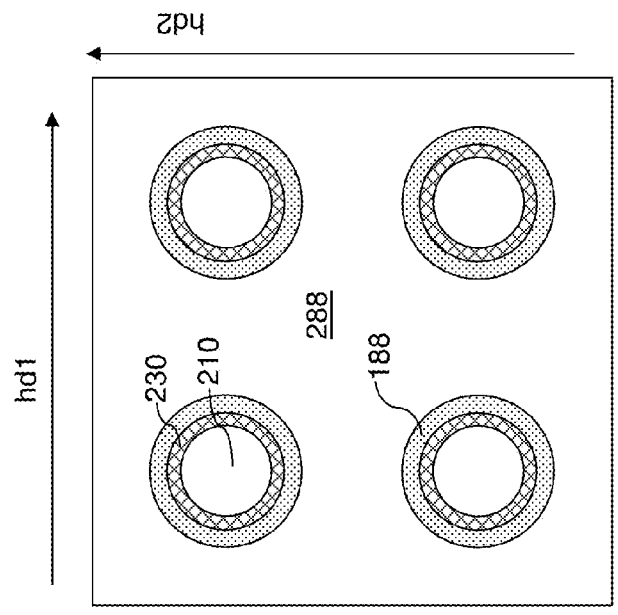
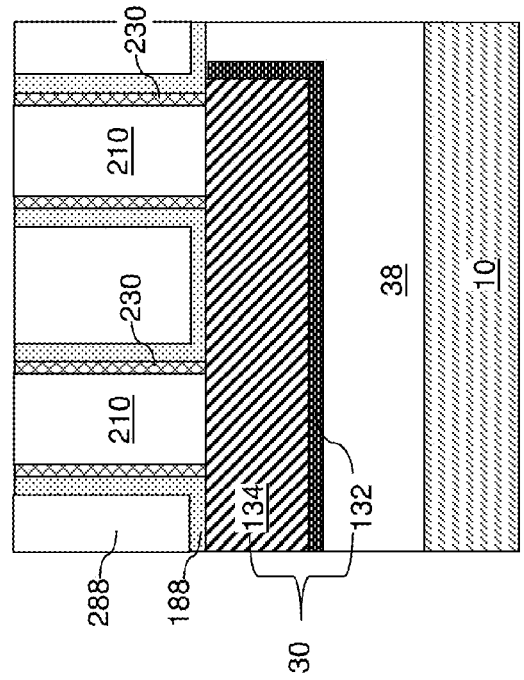
FIG. 9B
FIG. 9A

RESISTIVE MEMORY DEVICE HAVING SIDEWALL SPACER ELECTRODE AND METHOD OF MAKING THEREOF

FIELD

The present disclosure relates generally to the field of semiconductor devices and specifically to resistive memory devices, such as a non-volatile memory device employing a resistive storage element, and methods of making the same.

BACKGROUND

Previously known resistive memory devices are non-volatile memory devices employing non-volatile and reversible changes in resistance in a thin film with application of electrical voltage bias. As a "non-volatile" memory device, data stored in the resistive memory element does not change the value even when the power is turned off. In other words, the stored value of the data in any functional resistive memory device remains the same until the resistive memory element is reprogrammed, for example, in an erase operation or in a programming operation. The data stored in the non-volatile memory device can be reversed only when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a resistive memory device includes a first electrode, a sidewall spacer electrode located on a sidewall of a dielectric material contacting the first electrode, a resistive memory cell containing a resistive memory material and contacting the sidewall spacer electrode, and a second electrode containing the resistive memory cell.

According to another aspect of the present disclosure, a method of forming a resistive memory device includes forming a first electrode, forming a dielectric pillar over the first electrode, forming a continuous metallic material layer over the dielectric pillar, removing an upper portion of the continuous metallic material layer located above the dielectric pillar to form a sidewall spacer electrode located on a sidewall of the dielectric pillar and in contact with the first electrode, forming a resistive memory cell containing a resistive memory material and contacting the sidewall spacer electrode, and forming a second electrode containing the resistive memory cell.

BRIEF DESCRIPTION OF THE DRAWINGS

FIG. 2A illustrates the state of a resistive memory element of the present disclosure after programming into a low resistance state according to an embodiment of the present disclosure.

FIG. 2B illustrates the state of a resistive memory element of the present disclosure after programming into a high resistance state according to an embodiment of the present disclosure.

FIG. 4A is a vertical cross-sectional view of an exemplary structure after formation of a two-dimensional array of dielectric pillars according to an embodiment of the present disclosure.

FIG. 4B is a top-down view of the exemplary structure of FIG. 4A.

FIG. 5A is a vertical cross-sectional view of the exemplary structure after formation of a continuous metallic material layer according to an embodiment of the present disclosure.

FIG. 5B is a top-down view of the exemplary structure of FIG. 5A.

FIG. 7A is a vertical cross-sectional view of the exemplary structure after formation of a two-dimensional array of sidewall spacer electrodes arranged in rows and columns according to an embodiment of the present disclosure.

FIG. 7B is a top-down view of the exemplary structure of FIG. 7A.

FIG. 9A is a vertical cross-sectional view of the exemplary structure after planarization of the via level dielectric layer and the dielectric diffusion barrier layer according to an embodiment of the present disclosure.

FIG. 9B is a top-down view of the exemplary structure of FIG. 9A.

DETAILED DESCRIPTION

Figure 1:
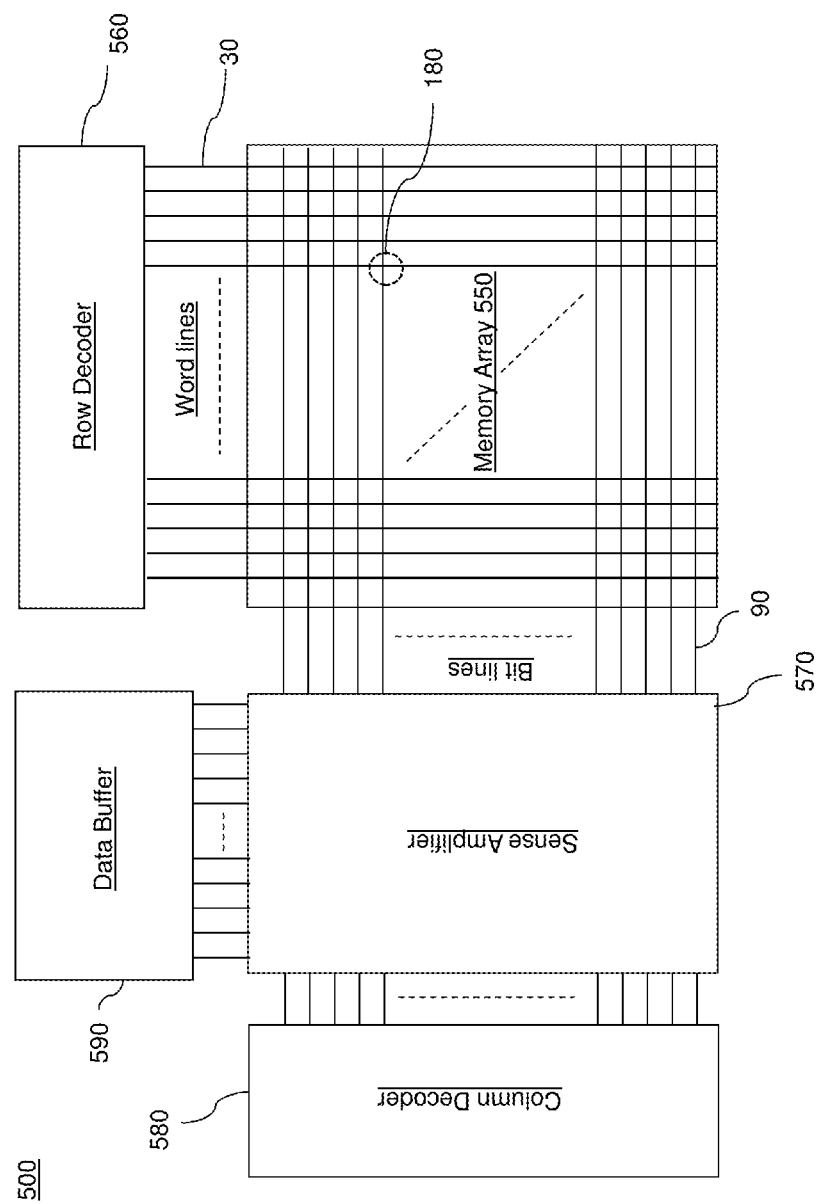
FIG. 1 is a schematic diagram of a memory device including resistive memory cells of the present disclosure in an array configuration.

As discussed above, the present disclosure is directed to a memory device, such as a non-volatile memory device employing a resistive storage element, and methods of making the same, the various aspects of which are described below. The embodiments of the disclosure can be employed to form various semiconductor devices including at least one non-volatile memory device. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a memory device, such as a non-volatile memory device employing a resistive memory element, and can be fabricated employing the various embodiments described herein. It is understood that a crisscross array of memory elements that can be accessed by any access scheme can be employed for the resistive memory devices of the present disclosure, and the exemplary structures of the present disclosure are described herein merely provide non-limiting examples of implementation of the memory devices of the present disclosure.

The present disclosure provides a memory device, such as a non-volatile memory device employing a resistive memory element. Electrical current through each resistive memory element can be limited by the cross-sectional area of a sidewall spacer electrode, such as a tubular electrode, which is herein referred to as a conductive tube.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, sense circuitry 570 (e.g., a sense amplifier) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

The sense circuitry 570 is configured to measure a resistive state of each of the resistive memory cells 180 through respective bit lines. The resistive memory cell 180 includes an optional barrier material portion 82 and a resistive memory material portion 86, as illustrated in FIGS. 2A and 2B. In one embodiment, each resistive memory cell 180 comprises a barrier modulated cell ("BMC") which includes the barrier material portion 82. The resistive memory material portion 86 may be an electrically conductive metal oxide that exhibits bulk electrical conduction (i.e., conductivity) by an oxygen vacancy mechanism. The resistive memory material portion 86 can be a material portion which does not form conductive filaments or change its phase (e.g., from amorphous to polycrystalline) to change from a high to a low resistance state. Examples of such conductive metal oxides include a slightly sub-stoichiometric metal oxide such as $TiO_{2-x}$, $SrTiO_{3-x}$, $NbO_{2-x}$, or $Nb:SrTiO_{3-x}$ where value of x can be independently selected from a range from 0 to 1, such as greater than zero to 1 (i.e., to form a sub-stoichiometric, oxygen deficient metal oxide). For example, the resistive memory material portion 86 may include titanium oxide, such as sub-stoichiometric titanium oxide having less than two oxygen atoms for each titanium atom. In one embodiment, the metal oxide may have a high concentration of free electrons in thermodynamic equilibrium n0 in a range from $1.0 \times 10^{20}/cm^3$ to $1.0 \times 10^{21}/cm^3$. The width of the resistive memory material portion 86 can be in a range from 10 nm to 120 nm, although lesser and greater widths can also be employed.

The barrier material portion 82 includes a barrier material that provides a suitable band gap in a range from 0.6 eV to 8 eV, such as 0.66 to 2.5 eV in order to provide a suitable level of electrical isolation between the resistive memory material portion 86 and a conductive material that provides electrical connection to the barrier material portion 82. For example, the barrier material portion can include a material portion that provides a suitable electronic barrier to limit current through the resistive memory material portion 86. In one embodiment, the barrier material portion 82 can include a material such as an amorphous semiconductor material selected from silicon, germanium, a silicon-germanium alloy, a silicon-carbon alloy, a silicon-germanium-carbon alloy, or a III-V compound semiconductor material. In one embodiment, the barrier material portion 82 includes a material selected from amorphous silicon, germanium and a silicon-germanium alloy, and the resistive memory material portion 86 includes titanium oxide. Alternatively, the barrier material portion 82 may comprise an electrically insulating material with an even higher band gap, such as amorphous or polycrystalline aluminum oxide having a band gap of about 7 to 7.6 eV. The width of the barrier material portion 82 can be in a range from 10 nm to 120 nm, although lesser and greater widths can also be employed. Generally, a wide band gap material requires a lesser thickness, and a narrow band gap material requires a greater thickness.

Referring to FIG. 2A, a set operation of a resistive memory cell 180 during programming into a low resistance state (LRS) from the high resistance state (HRS) (i.e., to turn the element "on") is illustrated. A negative voltage is applied to the resistive memory material portion 86 of the resistive memory cell 180 to generate an electric field along the direction from the barrier material portion 82 toward the resistive memory material portion 86. A set voltage Vst, which can be a negative voltage, is applied to the bit lines located adjacent to the resistive memory material portion 86. Pairs of oxygen interstitials (i.e., interstitial oxygen ions) and oxygen vacancies are generated in the resistive memory material portion 86 by the applied electric field. The oxygen interstitials drift into the barrier material portion 82 where they can form a semiconductor oxide region 87 at the boundary with portion 86. The semiconductor oxide region 87 (e.g., interface barrier) may be a germanium oxide if region 82 comprises germanium and can be silicon oxide and/or silicon-germanium oxide if region 82 comprises silicon or silicon-germanium. The resistive memory material portion 86 is programmed into a low resistance state in which a high concentration of oxygen vacancies near the interface with region 82 provides an electrically conductive path through the resistive memory material portion 86.

Referring to FIG. 2B, a reset operation of a resistive memory cell 180 during programming into the high resistance state (HRS) is illustrated. A positive voltage is applied to the resistive memory material portion 86 of the resistive memory cell 180 to generate an electric field along the direction from the resistive memory material portion 86 to the barrier material portion 82. A set voltage Vrs, which can be a positive voltage, is applied to the bit lines located adjacent to the resistive memory material portion 86. The oxygen interstitials generated from inside the semiconductor oxide region 87 in the barrier material portion 82 drift into defect-rich resistive memory material portion 86 to recombine with oxygen vacancies within the resistive memory material portion 86. The recombination of the oxygen interstitials and oxygen vacancies makes the resistive memory material portion 86 less conductive, and the cell is switched into the high resistance state (HRS). The read operation may be carried out in the positive voltage direction.

The measurement of the resistance of the resistive memory cells 180 is a non-destructive measurement process that does not disturb the resistive state of the resistive memory cells 180. Passing of electrical current through the resistive memory cells 180 under the measurement bias (i.e., read voltage) condition does not alter the concentration of oxygen vacancies in the barrier modulated cell (BMC) memory material portions 86. In other words, measuring the resistive state of the resistive memory cells 180 does not induce a change in an oxygen vacancy concentration in the barrier modulated cell memory material portions 86. Thus, the read operation under the read voltage does not disturb a resistance state of the barrier modulated cell memory material portion.

The electrical current required to program a resistive memory cell 180 is proportional to the area of the resistive memory cell 180 that is used to pass electrical current therethrough. Thus, the smaller the area of a resistive memory cell 180 that is employed as an electrically conductive path, the less the amount of electrical current required to operate the resistive memory cell. According to an aspect of the present disclosure, a criss-cross array configuration for resistive memory cells 180 is employed in combination with an array of sidewall spacer electrodes located at each intersection of the criss-cross array to provide a resistive memory device that enables low current operation.

Figure 3A:
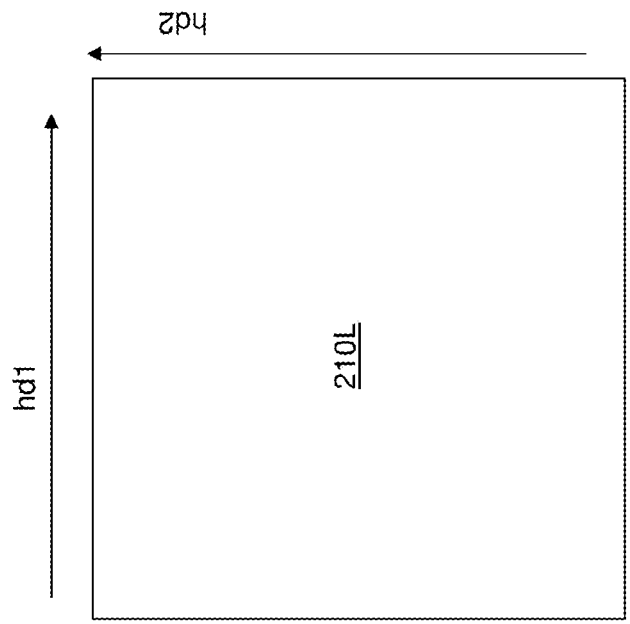
FIG. 3A is a vertical cross-sectional view of an exemplary structure after formation of first electrically conductive lines and a dielectric template layer according to an embodiment of the present disclosure.
Figure 3B:
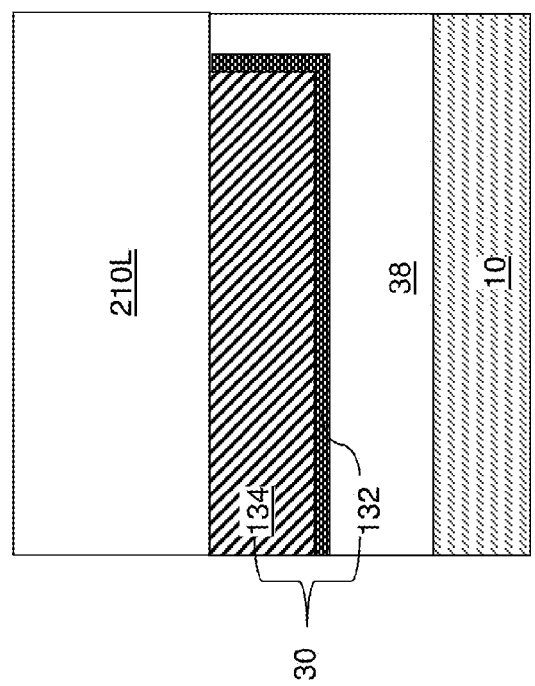
FIG. 3B is a top-down view of the exemplary structure of FIG. 3A.

Referring to FIGS. 3A and 3B, an exemplary structure according to an embodiment structure is illustrated, which is an in-process structure that can be employed to form a resistive memory device. As used herein, an "in-process" structure refers to a structure that is present during a manufacturing step and is subsequently modified in a later processing step. The exemplary structure includes a first line level dielectric layer 38 and a plurality of first electrically conductive lines 30 embedded with the first line level dielectric layer 38. The first line level dielectric layer 38 can be formed on, or over, a substrate 10. The substrate 10 can include a semiconductor substrate with peripheral semiconductor devices for supporting operation of the resistive memory array to be subsequently formed. For example, the semiconductor devices on the semiconductor substrate can include various components of the resistive random access memory device 500 shown in FIG. 1. Further, the substrate 10 can include at least one level of metal interconnect structures embedded in respective dielectric material layers.

The first line level dielectric layer 38 includes a dielectric material such as silicon oxide, organosilicate glass, silicon nitride, and/or at least one dielectric metal oxide (such as aluminum oxide). In one embodiment, the first line level dielectric layer 38 can include a silicon-oxide based dielectric material such as undoped silicate glass or doped silicate glass (such as borophosphosilicate glass or fluorosilicate glass). The first line level dielectric layer 38 can be deposited by a conformal deposition process (such as low pressure chemical vapor deposition) or a non-conformal deposition process (such as plasma enhanced chemical vapor deposition). The thickness of the first line level dielectric layer 38 can be in a range from 30 nm to 300 nm, although lesser and greater thicknesses can also be employed.

Line trenches extend along a first horizontal direction hd1 in an upper portion of the first line level dielectric layer 38. As used herein, a line trench refers to a trench that extends along a lengthwise direction. The line trenches can be formed, for example, by applying a photoresist layer over the top surface of the first line level dielectric layer 38, lithographically patterning openings that extend along the first horizontal direction hd1 through the photoresist layer, and by anisotropically etching unmasked portions of the first line level dielectric layer 38 employing the patterned photoresist layer as an etch mask. Each line trench can extend along the first horizontal direction hd1, have a uniform width along a second horizontal direction hd2, be laterally spaced from one another along the second horizontal direction hd2, and can have a uniform depth. The remaining portions of the photoresist layer can be removed, for example, by ashing.

At least one metallic material can be deposited in the line trenches. For example, a first metallic liner 132 and a first conductive metal potion 134 can be sequentially deposited in the line trenches. Each first metallic liner 132 in a line trench can include a metallic barrier material that functions as a diffusion barrier layer and/or an adhesion promotion layer. For example, each first metallic liner 132 can include a conductive metallic compound such as a conductive metallic nitride (such as TiN, TaN, or WN) or a conductive metallic carbide (such as TiC, TaC, or WC). The thickness of each first metallic liner 132 can be in a range from 3 nm to 10 nm, although lesser and greater thicknesses can also be employed. Each first conductive metal portion 134 in a line trench includes at least one conductive metal such as W, Cu, Al, Co, Ru, Ti, and/or Ta. In one embodiment, each first conductive metal portion 134 can consist essentially of a single metal such as W, Al, or Cu.

Excess portions of the deposited metallic material can be removed from above a horizontal plane including the top surface of the first line level dielectric layer 38, for example, by chemical mechanical planarization (CMP). Each remaining adjoining set of a first metallic liner 132 and a first conductive material portion 134 constitutes a first electrically conductive line 30. The first electrically conductive lines 30 laterally extend along the first horizontal direction hd1, and are laterally spaced from one another along the second horizontal direction hd2. In one embodiment, the first electrically conductive lines 30 can form a one-dimensional periodic array having a periodicity along the second horizontal direction hd2.

Alternatively, instead of forming the first electrically conductive lines 30 employing a damascene method as described above, the first electrically conductive lines 30 and the first line level dielectric layer 38 can be formed by forming the first electrically conductive lines 30 first, and subsequently depositing and planarizing a dielectric material to form the first line level dielectric layer 38.

Each first electrically conductive line 30 can be a rail structure. As used herein, a "rail structure" refers to a structure that extends along a horizontal direction with a constant vertical cross-sectional shape. The first electrically conductive lines 30 collectively constitute a set of first rail structures disposed over the substrate.

A dielectric template layer 210L can be subsequently formed over the top surface of the first line level dielectric layer 38. The dielectric template layer 210L includes a dielectric material such as silicon oxide, silicon nitride, or organosilicate glass. For example, the dielectric template layer 210 includes a non-porous dielectric material such as silicon oxide or doped silicate glass. The thickness of the dielectric template layer 210L can be in a range from 30 nm to 600 nm, although lesser and greater thicknesses can also be employed.

Referring to FIGS. 4A and 4B, a photoresist layer 217 is applied over the dielectric template layer 210, and is lithographically patterned to form isolated pillar patterns. Each lithographically patterned portion of the photoresist layer 217 can be positioned to form a two-dimensional array of pillar patterns. The two-dimensional array of pillar patterns formed by the discrete portions of the photoresist layer 217 can be repeated along the first horizontal direction hd1 with a first periodicity, and along the second horizontal direction hd2 with a second periodicity. The second horizontal direction hd2 may be orthogonal to the first horizontal direction hd1.

In one embodiment, each lithographically patterned portion of the photoresist layer 217 can be located within areas of the set of the first rail structures, i.e., within the areas of the first electrically conductive lines 30. Each electrically patterned portion of the photoresist layer 217 can have a same horizontal cross-sectional shape, which can be a circular shape, an elliptical shape, a rectangular shape, or another polygonal or curvilinear closed shape. In one embodiment, the electrically patterned portion of the photoresist layer 217 can have a substantially circular shape of the same size.

An anisotropic etch is performed to remove portions of the dielectric template layer 210L that is not covered by the patterned portions of the photoresist layer 217. A two-dimensional array of dielectric pillars 210 can be formed on the top surfaces of the first electrically conductive lines 30. Each dielectric pillar 210 can have a cylindrical shape, i.e., a shape having the same horizontal cross-sectional shape throughout the entirety of the shape. In one embodiment, the dielectric pillars 210 can have the same substantially circular cylindrical shape. Alternatively, the dielectric pillars 210 can have an elliptical shape, a rectangular shape, or another polygonal (e.g., triangular, hexagonal, etc.) or curvilinear closed horizontal cross sectional shape. In one embodiment, the entirety of each bottom surface of the dielectric pillars 210 can be in physical contact with a top surface of a respective first electrically conductive layer 30. The photoresist layer 217 can be subsequently removed, for example, by ashing.

Referring to FIGS. 5A and 5B, a continuous metallic material layer 230L can be formed by a conformal deposition method such as chemical vapor deposition (CVD) or atomic layer deposition (ALD). The continuous metallic material layer 230L can be formed over the first rail structures (as embodied as the first electrically conductive lines 30) on top and sidewall(s) of the array of dielectric pillars 210, and can have a substantially uniform thickness throughout. As used herein, a "substantially uniform thickness" refers to a thickness distribution that does not deviate from the average thickness by more than 30%.

In one embodiment, the continuous metallic material layer 230L includes a polycrystalline metallic (i.e., electrically conductive) material, i.e., a metallic material having grains that contact one another at grain boundaries. For example, the continuous metallic material layer 230L can include a metallic nitride material such as TiN, TaN, or WN. The average thickness of the continuous metallic material layer 230L can be in a range from 2 nm to 10 nm, such as from 3 nm to 5 nm, although lesser and greater thicknesses can also be employed.

In one embodiment, a predominant portion of grain boundaries 211 in the horizontal portions of the polycrystalline metallic material layer 230L (i.e., portions of layer 230L located on layers 30 or on top of pillars 210) can extend along a direction within 15 degrees (i.e., 0 to 15 degrees) from the surface normal of the top surface of the substrate 10. Furthermore, a predominant portion of grain boundaries 211 in the vertical portions of the polycrystalline metallic material layer 230L (i.e., portions of layer 230L located on sidewall(s) of pillars 210) can extend along a direction within 15 degrees (i.e., 0 to 15 degrees) from the surface normal of the sidewall(s) of the dielectric pillars 210, as shown in the inset of FIG. 5A. As used herein, a "predominant portion" refers to a portion that is more than 50% of an entire structure. For example, in case the polycrystalline metallic material includes one of TiN, TaN, and WN, a predominant portion of grain boundaries in the polycrystalline metallic material can extend along a direction within 15 degrees from the surface normals described above. Thus, a predominant portion of grain boundaries for each horizontal portion of the continuous metallic material layer 230L can be within 15 degrees from the vertical direction, and a predominant portion of grain boundaries for each vertical portion of the continuous metallic material layer 230L can be within 15 degrees from the horizontal plane.

Figure 6:
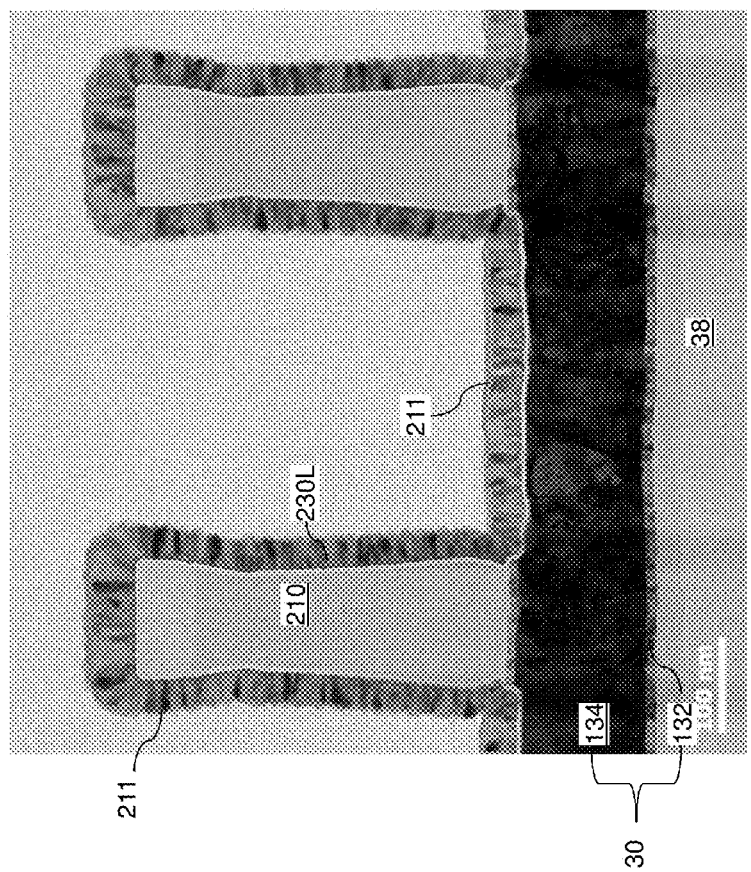
FIG. 6 is a transmission electron micrograph (TEM) of a physical structure including structural elements of the exemplary structure of FIGS. 5A and 5B.

The alignment of a predominant portion of grain boundaries along a direction perpendicular to a local interface with an underlying material portion is illustrated in FIG. 6, which shows transmission electron micrograph (TEM) of a physical structure including structural elements of the exemplary structure of FIGS. 5A and 5B. In this case, the first line level dielectric layer 38 includes silicon oxide, the first metallic liner 132 includes TiN, the first conductive material portion 134 includes tungsten, the dielectric pillars 210 include silicon oxide, and the metallic material layer 230L includes TiN. FIG. 6 illustrates that a predominant portion of grain boundaries extend along a direction that is within 15 degrees from the surface normals described above. Thus, a predominant portion of grain boundaries for each horizontal portion of the continuous metallic material layer 230L are substantially vertical, and a predominant portion of grain boundaries for each vertical portion of the continuous metallic material layer 230L are substantially horizontal.

Referring to FIGS. 7A and 7B, an optional anisotropic etch can be performed to remove horizontal portions of the continuous metallic material layer 230L. The anisotropic etch can be terminated when physical exposure of the top surface of the dielectric pillars 210 is detected, i.e., employing the dielectric pillars 210 as an endpoint detection structure. FIG. 7A is a vertical cross-sectional view of the exemplary structure after formation of a two-dimensional array of sidewall spacer electrodes arranged in rows and columns according to an embodiment of the present disclosure.

If the etch shown in FIGS. 7A and 7B is carried out, then the remaining portions of the continuous metallic material layer 230L constitute a two-dimensional array of sidewall spacer electrodes 230, such as conductive tubes or other shaped electrodes. If the etch shown in FIGS. 7A and 7B is not carried out, then the sidewall spacer electrodes 230 are formed after the planarization step shown in FIG. 9D and as will be described in more detail below. Each sidewall spacer electrode 230 can have a circular, elliptical, rectangular, another polygonal (e.g., triangular or hexagonal) or curvilinear horizontal cross sectional shape. Preferably, the sidewall spacer electrode 230 contacts all sidewall(s) of the dielectric pillars 210. However, in an alternative embodiment, the sidewall spacer electrode 230 can be selectively removed from all or parts of the sidewall(s) of the dielectric pillar 210.

If each sidewall spacer electrode 230 has a circular horizontal cross sectional shape, then each sidewall spacer electrode 230 has a hollow cylinder or tubular shape that encloses the dielectric pillar 210 and the electrode 230 can be referred to as a conductive tube 230. In one embodiment, each conductive tube 230 can have an annular horizontal cross-sectional shape that is invariant with vertical translation within the conductive tube 230. Alternatively, in case sidewalls of the dielectric pillars 210 have a non-zero taper angle, the inner and outer sidewalls of the conductive tubes 230 may be tapered such that the outer periphery of a cross-sectional shape of each conductive tube 230 provides a lesser area with increasing height (i.e., with an increase in the vertical distance from the horizontal plane including the top surface of the first line level dielectric layer 38). In one embodiment, each conductive tube 230 can have a substantially uniform thickness throughout.

The two-dimensional array of sidewall spacer electrodes 230 can be arranged in rows and columns. Each row of sidewall spacer electrodes 230 in the two-dimensional array can contact a respective first rail structure (such as a first electrically conductive line 30). Each sidewall spacer electrode 230 within the two-dimensional array of sidewall spacer electrodes 230 can be formed around a respective dielectric pillar 210. In one embodiment, the entire bottom area of each sidewall spacer electrode 230 can be in physical contact with a top surface of an underlying first electrically conductive layer 30.

Figure 8B:
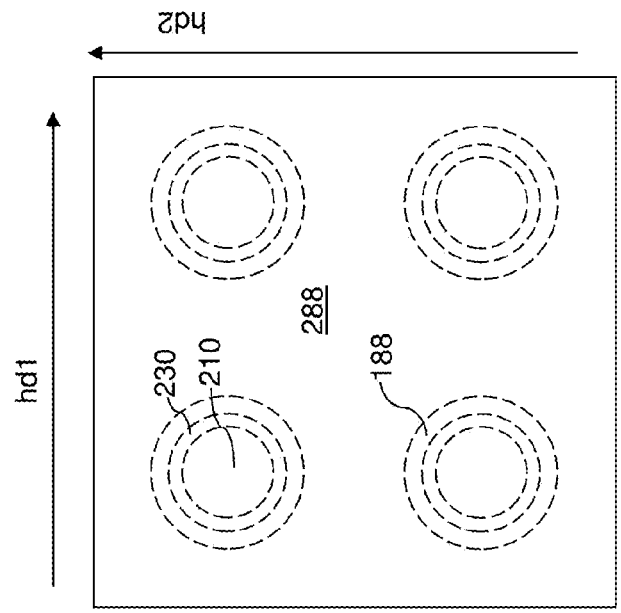
FIG. 8B is a top-down view of the exemplary structure of FIG. 8A.
Figure 8A:
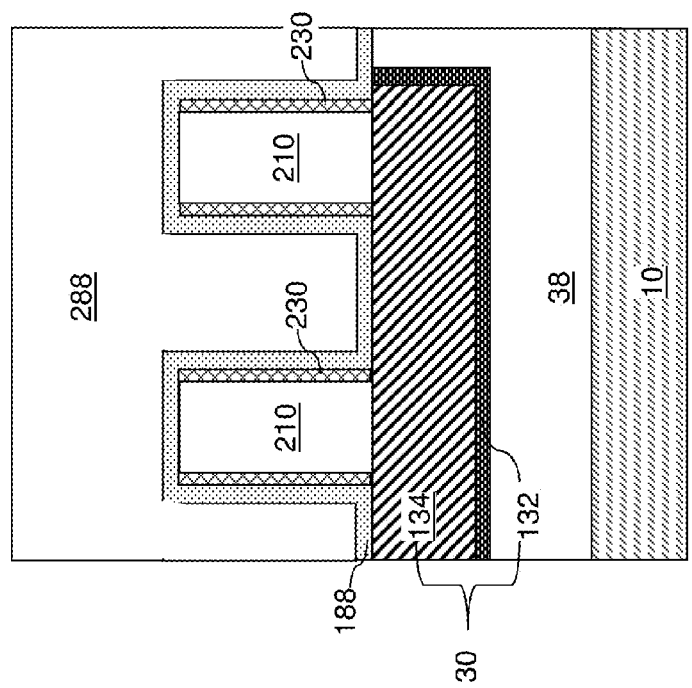
FIG. 8A is a vertical cross-sectional view of the exemplary structure after formation of a dielectric diffusion barrier layer and a via level dielectric layer according to an embodiment of the present disclosure.

Referring to FIGS. 8A and 8B, an optional dielectric diffusion barrier layer 188 and a via level dielectric layer 288 can be sequentially deposited. The dielectric diffusion barrier layer 188 can be deposited over the set of first rail structures (i.e., the first electrically conductive lines 30) and around the two-dimensional array of sidewall spacer electrodes 230. The dielectric diffusion barrier layer 188 includes a dielectric material that retards, or blocks, diffusion of impurity materials or ions (such as fluorine ions). For example, the dielectric diffusion barrier layer 188 can include silicon nitride or aluminum oxide. The dielectric diffusion barrier layer 188 can be deposited by a conformal deposition process such as low pressure chemical vapor deposition (LPCVD) or atomic layer deposition. The thickness of the dielectric diffusion barrier layer 188 can be in a range from 3 nm to 10 nm, although lesser and greater thicknesses can also be employed.

The via level dielectric layer 288 includes a self-planarizing dielectric material (such as spin-on glass) or a planarzable dielectric material (such as doped silicate glass or undoped silicon oxide). The via level dielectric layer 288 can be deposited by spin-coating or a conformal or non-conformal deposition process. The via level dielectric layer 288 is deposited at a thickness that is sufficient to fill the volumes between the dielectric pillars 210. A gapfill reflow process may be optionally performed to reduce or remove cavities formed between the dielectric pillars 210.

Referring to FIGS. 9A and 9B, the via level dielectric layer 288 can be planarized, for example, by chemical mechanical planarization, a recess etch, or a combination thereof. If a dielectric diffusion barrier layer 188 is employed, the horizontal portions of the dielectric diffusion barrier layer 188 overlying the dielectric pillars 210 can be employed as a stopping structure for the first step of the planarization process. At the end of the first step of the planarization process, the planarized top surface of the via level dielectric layer 288 can be coplanar with (i.e., within the same plane as) the top surface of the horizontal portions of the dielectric diffusion barrier layer 188 overlying the dielectric pillars 210. A second step of the planarization process can remove the horizontal portions of the dielectric diffusion barrier layer 188 and the via level dielectric layer 288 without selectivity, i.e., at about the same removal rate. The second step of the planarization process can stop when the top surfaces (e.g., top edge surfaces) of the sidewall spacer electrodes 230 are physically exposed. At the end of the second step of the planarization process, annular top surfaces of the sidewall spacer electrodes 230 can be physically exposed. The annular top surfaces of the sidewall spacer electrodes 230 can be located within the same horizontal plane as annular top surfaces of the dielectric diffusion barrier layer 188 and the top surface of the via level dielectric layer 288.

Figure 9C:
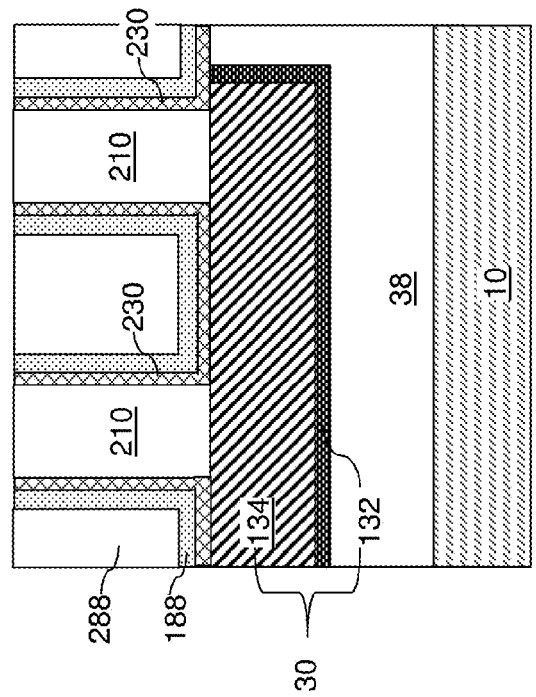
FIGS. 9C and 9D are vertical cross-sectional views of the exemplary structure according to an alternative embodiment of the present disclosure.
Figure 9D:
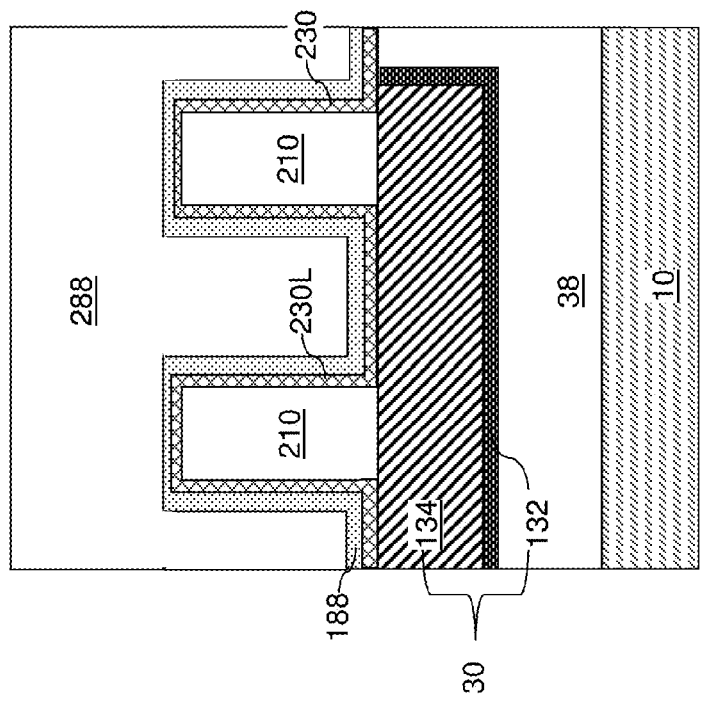

In an alternative embodiment shown in FIGS. 9C and 9D, the anisotropic etch step shown in FIG. 7A is omitted. In this embodiment, the dielectric diffusion barrier layer 188 and the via level dielectric layer 288 are deposited on the vertical and horizontal surfaces of the metallic material layer 230L, as shown in FIG. 9C. In this embodiment, the planarization process includes a third step in which the upper horizontal surface of the metallic material layer 230L located above the dielectric pillar 210 is removed by chemical mechanical planarization or etch back to form the sidewall spacer electrodes 230, as shown in FIG. 9D. In this embodiment, the sidewall spacer electrodes 230 are connected by remaining horizontal portions of the metallic material layer 230L located over the first electrically conductive lines 30.

Figure 10A:
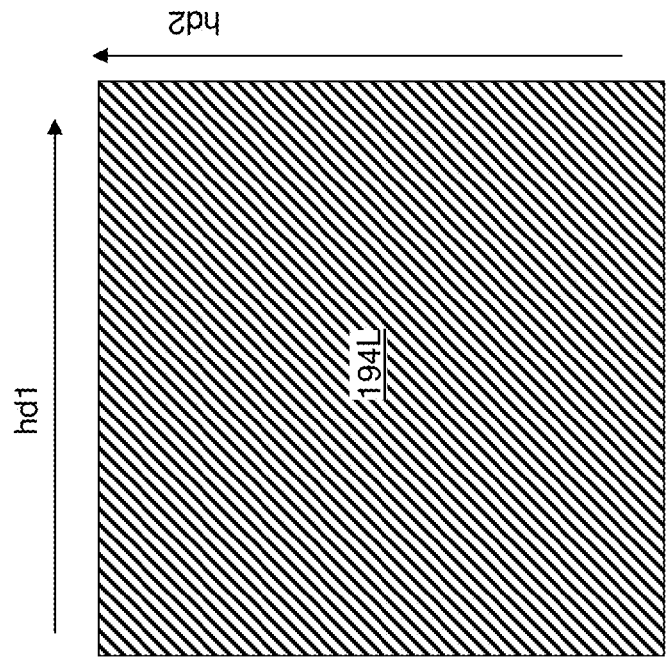
FIG. 10A is a vertical cross-sectional view of the exemplary structure after formation of a barrier material layer, a resistive memory material layer, a metallic liner layer, and a conductive material layer according to an embodiment of the present disclosure.
Figure 10B:
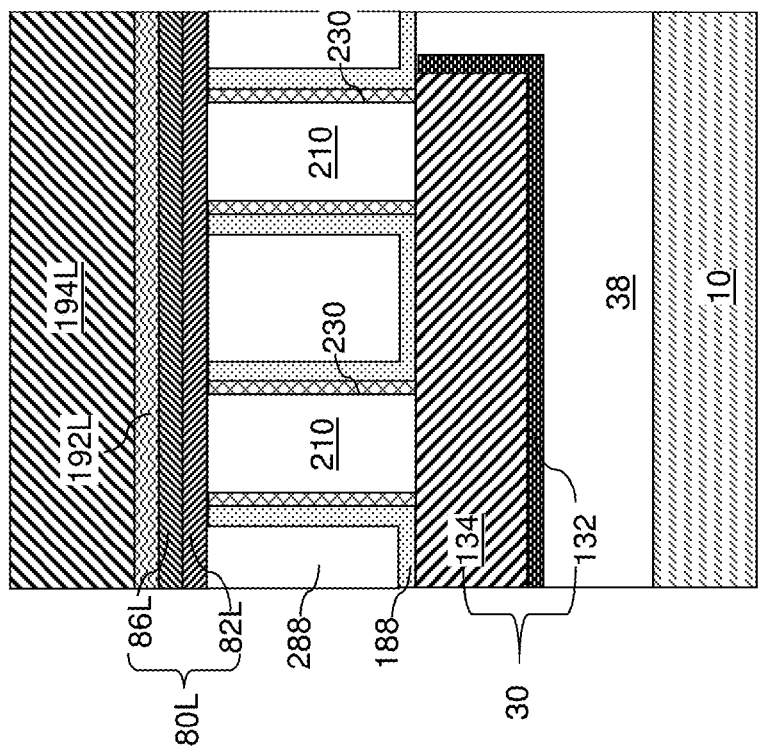
FIG. 10B is a top-down view of the exemplary structure of FIG. 10A.

Referring to FIGS. 10A and 10B, a layer stack including an optional barrier material layer 82L, a resistive memory material layer 86L, an optional metallic liner layer 192L, and a conductive material layer 194L can be deposited. The optional barrier material layer 82L and the resistive memory material layer 86L are collectively referred to as a memory-material-containing layer (82L, 86L) which contacts the top edge surfaces of the sidewall spacer electrodes 230. The layer stack (82L, 86L, 192L, 194L) can include, from bottom to top, a memory-material-containing layer (82L, 86L), an optional metallic liner layer 192L, and a conductive material layer 194L. While the present disclosure is described employing an embodiment in which the resistive memory material layer 86L overlies the barrier material layer 82L, embodiments are expressly contemplated in which the barrier material layer 82L overlies the resistive memory material layer 86L.

The optional barrier material layer 82L, if present, includes a material that can be employed for the barrier material portion 82 illustrated in FIGS. 2A and 2B. Thus, the barrier material layer 82L includes a barrier material that provides a suitable band gap in a range from 0.6 eV to 8 eV, such as 0.66 to 2.5 eV in order to provide a suitable level of electrical isolation between the resistive memory material layer 86L (which can be a barrier modulated cell memory material layer) and the conductive material of the sidewall spacer electrodes 230. For example, the barrier material portion can include a material portion that provides a suitable electronic barrier to limit current through the resistive memory material layer 86L. In one embodiment, the barrier material layer 82L can include a material such as an amorphous semiconductor material selected from silicon, germanium, a silicon-germanium alloy, a silicon-carbon alloy, a silicon-germanium-carbon alloy, or a III-V compound semiconductor material. In one embodiment, the barrier material layer 82L includes a material selected from amorphous silicon, germanium and a silicon-germanium alloy, and the resistive memory material portion 86 includes titanium oxide. Alternatively, the barrier material layer 82L may comprise an electrically insulating material with an even higher band gap, such as amorphous or polycrystalline aluminum oxide having a band gap of about 7 to 7.6 eV. The thickness of the barrier material layer 82L can be in a range from 10 nm to 120 nm, although lesser and greater widths can also be employed. Generally, a wide band gap material requires a lesser thickness, and a narrow band gap material requires a greater thickness.

The resistive memory material layer 86L can include any material that can be employed for the resistive memory material portion 86 of FIGS. 2A and 2B. Thus, the resistive memory material layer 86L can include an electrically conductive metal oxide that exhibits bulk electrical conduction (i.e., conductivity) by an oxygen vacancy mechanism. The resistive memory material layer 86L includes a material which does not form conductive filaments or change its phase (e.g., from amorphous to polycrystalline) to change from a high to a low resistance state. Examples of such conductive metal oxides include a slightly sub-stoichiometric metal oxide such as $TiO_{2-x}$, $SrTiO_{3-x}$, $NbO_{2-x}$, or $Nb:SrTiO_{3-x}$ where value of x can be independently selected from a range from 0 to 1, such as greater than zero to 1 (i.e., to form a sub-stoichiometric, oxygen deficient metal oxide). For example, the resistive memory material layer 86L may include titanium oxide, such as sub-stoichiometric titanium oxide having less than two oxygen atoms for each titanium atom. In one embodiment, the metal oxide may have a high concentration of free electrons in thermodynamic equilibrium n0 in a range from $1.0\times10^{20}/cm^3$ to $1.0\times10^{21}/cm^3$. The thickness of the resistive memory material layer 86L can be in a range from 10 nm to 120 nm, although lesser and greater widths can also be employed.

The metallic liner layer 192L can include a metallic barrier material that functions as a diffusion barrier layer and/or an adhesion promotion layer. In one embodiment, the metallic liner layer 192L can include a conductive metallic compound such as a conductive metallic nitride (such as TiN, TaN, or WN) or a conductive metallic carbide (such as TiC, TaC, or WC). The thickness of the metallic liner layer 192L can be in a range from 3 nm to 10 nm, although lesser and greater thicknesses can also be employed.

The conductive material layer 194L includes at least one conductive metal such as W, Cu, Al, Co, Ru, Ti, and/or Ta. In one embodiment, each first conductive metal portion 134 can consist essentially of a single metal such as W, Al, or Cu. The thickness of the conductive material layer 194L can be in a range from 10 nm to 600 nm, although lesser and greater thicknesses can also be employed.

Figures 11A, 11B:
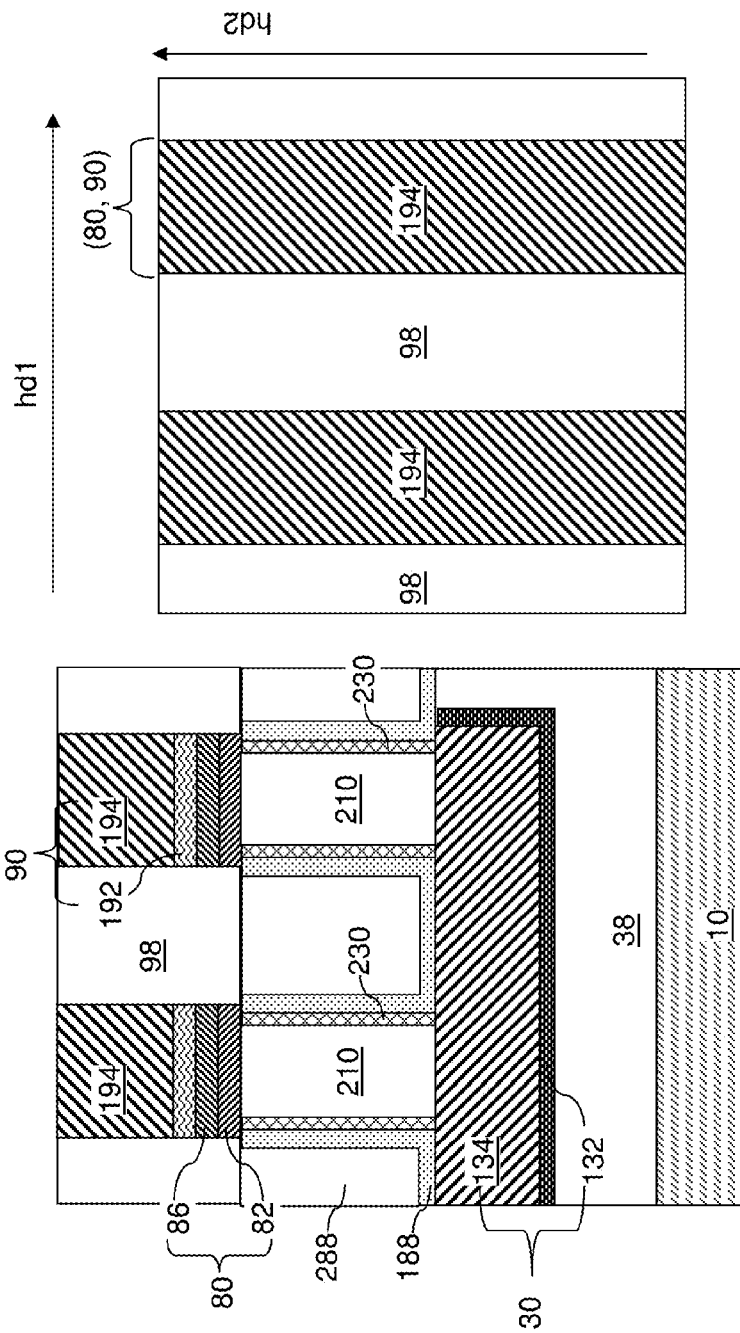
FIG. 11A is a vertical cross-sectional view of the exemplary structure after formation of memory-material-containing lines, second electrically conductive lines, and a second line level dielectric layer according to an embodiment of the present disclosure.
FIG. 11B is a top-down view of the exemplary structure of FIG. 11A.

Referring to FIGS. 11A and 11B, the layer stack (82L, 86L, 192L, 194L) of the conductive material layer 194L, the optional metallic liner layer 192L, and the memory-material-containing layer (82L, 86L) can be patterned into second rail structures (80, 90). For example, a photoresist layer (not shown) can be applied over the layer stack (82L, 86L, 192L, 194L) to form strips that laterally extend along the second horizontal direction hd2, and laterally spaced from one another along the first horizontal direction hd1. The pattern of the photoresist layer can be transferred through the layer stack (82L, 86L, 192L, 194L) for form the second rail structures (80, 90).

The layer stack (82L, 86L, 192L, 194L) can be patterned such that the entirety of each top surface of the sidewall spacer electrodes 230 is contacted by the bottom surfaces of the second rail structures (80, 90). The area of each sidewall spacer electrode 230 can be entirely within an intersection of the area of a first rail structure (as embodied as a first electrically conductive line 30) and a second rail structure (80. 90). Thus, the entire bottom surface of each sidewall spacer electrode 230 can contact a first rail structure 30 and the entire top surface of each sidewall spacer electrode 230 can contact a second rail structure (80, 90).

Each second rail structure (80, 90) can include a memory-material-containing line 80 and a second electrically conductive line 90. Each memory-material-containing line 80 includes at least a resistive memory material portion 86. Specifically, each memory-material-containing line 80 includes a resistive memory material portion 86 (which can be a barrier modulated cell memory material portion) and can optionally include a barrier material portion 82 contacting the resistive memory material portion 86. If the barrier material portion 82 is present, the barrier material portion 82 may underlie or overlie the resistive memory material portion 86. In one embodiment, the resistive memory material portion 86 can be a barrier modulated cell memory material portion that includes a non-filamentary, electrically conductive metal oxide, and the barrier material portion 82 include an amorphous semiconductor material (such as amorphous silicon, amorphous germanium, an amorphous silicon-germanium alloy, or an amorphous compound semiconductor material). Each memory-material-containing line 80 can have a substantially uniform thickness throughout.

Each second electrically conductive line 90 can have substantially the same width as the underlying memory-material-containing line 80. Each second electrically conductive line 90 can include a metallic liner line 192 and a conductive material line 194, which are patterned portions of the metallic liner layer 192L and the conductive material layer 194L, respectively. The second rail structures (80, 90) extend along a common lengthwise direction (such as the second horizontal direction hd2).

Subsequently, a dielectric material such as silicon oxide can be deposited between the second rail structures (80, 90) and planarized to form a second line level dielectric layer 98. The top surfaces of the second rail structures (80, 90) can be coplanar with the top surface of the second line level dielectric layer 98.

While the present disclosure is described employing an embodiment in which the second rail structures (80, 90) are patterned prior to formation of the second line level dielectric layer 98, embodiments are expressly contemplated herein in which the second rail structures are formed by a damascene method. In such embodiments, a planar dietetic material layer having a uniform thickness throughout is formed, line trenches extending along the second horizontal direction are formed through the second line level dielectric layer 98, and the line trenches are filled with a layer stack (82L, 86L, 192L, 194L) of an conductive material layer 194L, layer stack (82L, 86L, 192L, 194L) of a memory-material-containing layer (82L, 86L), an optional metallic liner layer 192L, and a conductive material layer 194L. Portions of the layer stack (82L, 86L, 192L, 194L) located above a horizontal plane including the top surface of the second line level dielectric layer 98 can be removed by a planarization process. Referring to FIGS. 5A, 6 and 11A, a predominant portion of grain boundaries in the vertical portion of the polycrystalline sidewall spacer electrodes 230 extend along a direction within 15 degrees from horizontal plane located between the barrier material portion 82 and the resistive memory material portion 86.

While the present disclosure is described employing an embodiment in which memory-material-containing line 80 are formed after formation of sidewall spacer electrodes 230, the memory-material-containing lines 80 can be formed as portions of first rail structures that are formed prior to formation of the sidewall spacer electrodes 230. In this case, the first rail structures can include vertical stacks, from bottom to top, of a first electrically conductive line 30 and a memory-material-containing line 80 that has the same with as the underlying first electrically conductive line 80.

Generally speaking, a set of first rail structures can be formed over a substrate 10, followed by formation of a two-dimensional array of dielectric pillars 210 and sidewall spacer electrodes 230, and then followed by formation of a set of second rail structures. One set among the set of first rail structures and the set of second rail structures comprises electrically conductive lines (which are herein referred to as first electrically conductive lines 30) that contact respective subsets of the two-dimensional array of sidewall spacer electrodes 230. Another set among the set of first rail structures and the set of second rail structures comprises stacks of a memory-material-containing line 80 including a resistive memory material and an electrically conductive line (which is herein referred to as a second electrically conductive line 90). Each memory-material-containing line 80 contacts a respective subset of the two-dimensional array of sidewall spacer electrodes 230.

Figure 12:
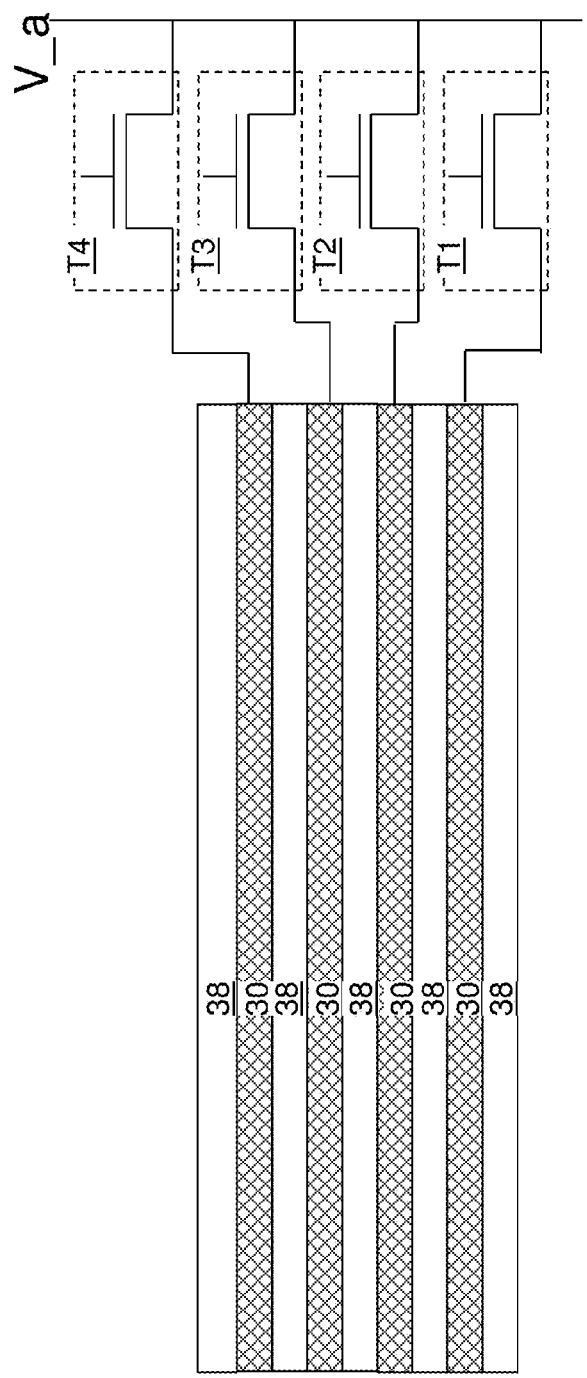
FIG. 12 is a schematic for a first set of access transistors connected to the first electrically conductive lines in a resistive random access memory device.
Figure 13:
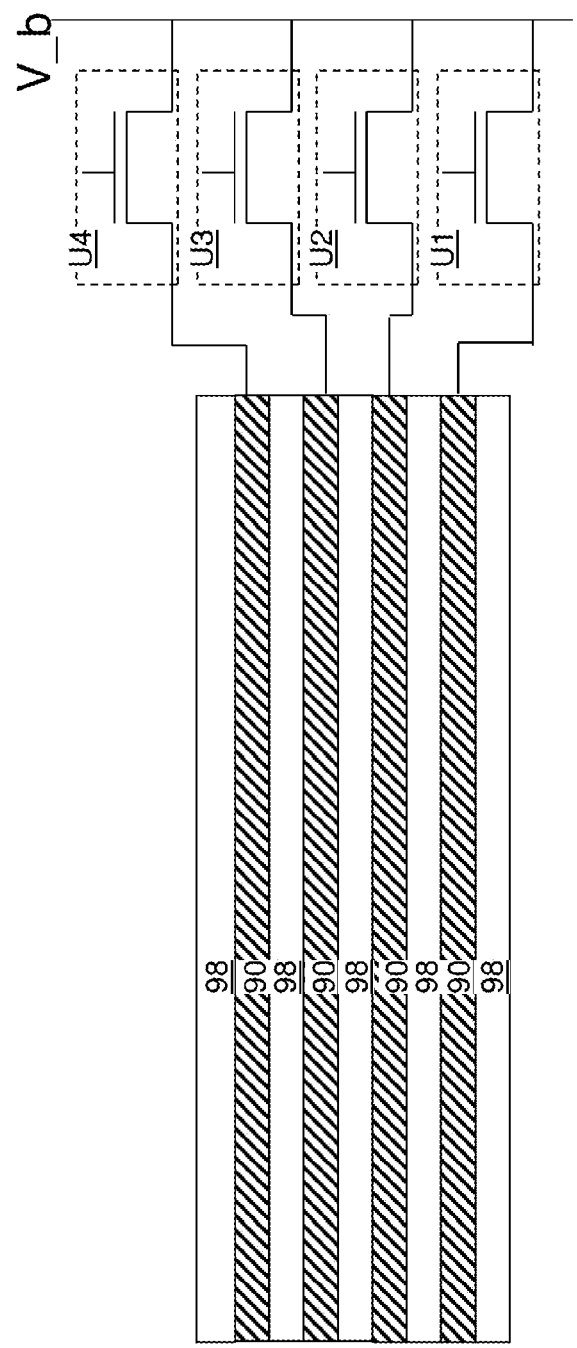
FIG. 13 is a schematic for a second set of access transistors connected to the second electrically conductive lines in a resistive random access memory device.

Access transistors can be connected to each of the first electrically conductive lines 30 and the second electrically conductive lines 90. FIG. 12 is a schematic for a first set of access transistors (T1, T2, T3, T4) connected to the first electrically conductive lines 30 in a resistive random access memory device. The source node of each access transistor (T1, T2, T3, T4) can be connected to a word line access voltage V_a, which can be varied depending on the operational mode (e.g., a program mode or a read mode) of the memory devices. FIG. 13 is a schematic for a second set of access transistors (U1, U2, U3, U4) connected to the second electrically conductive lines 90 in a resistive random access memory device. The source node of each access transistor (U1, U2, U3, U4) can be connected to a bit line access voltage V_b, which can be varied depending on the operational mode (e.g., a program mode or a read mode) of the memory devices. The word line connections and the bit line connections may be interchanged as needed.

The various embodiments of the present disclosure provide a resistive memory device. The resistive memory device includes a first electrode (portion of line 30), a sidewall spacer electrode 230 located on a sidewall of a dielectric material contacting the first electrode, a resistive memory cell 180 containing a resistive memory material 86 and contacting the sidewall spacer electrode 230, and a second electrode (portion of line 90) containing the resistive memory cell 180.

In one embodiment, the sidewall spacer electrode 230 is located on a sidewall of a dielectric pillar 210. In one embodiment, the sidewall spacer electrode 230 comprises a conductive tube which laterally surrounds the dielectric pillar 210.

In one embodiment, the sidewall spacer electrode 230 comprises a polycrystalline metallic material. A predominant portion of grain boundaries 211 in a vertical portion of the polycrystalline metallic material are substantially horizontal. For example, the predominant portion of the grain boundaries 211 in the vertical portion of the polycrystalline metallic material extend along a direction within 15 degrees from a surface normal to a sidewall of the dielectric pillar 210, as shown in FIGS. 5A and 6.

In one embodiment, the sidewall spacer electrode 230 comprises one of a two-dimensional array of sidewall spacer electrodes located on a respective sidewalls of a plurality of dielectric pillars 210. The first electrode comprises one of a plurality of first electrically conductive lines 30, each contacting a respective row of sidewall spacer electrodes 230. The resistive memory cell 180 comprises one of a plurality of memory-material-containing lines 80. The second electrode comprises one of a plurality second electrically conductive lines 90, each of which contacts a respective memory-material-containing line 80.

In one embodiment, each sidewall spacer electrode 230 within the two-dimensional array laterally surrounds a dielectric pillar 210. In one embodiment, a first planar surface of each dielectric pillar 210 contacts a respective first electrically conductive line 30, and a second planar surface of each dielectric pillar 210 contacts a respective memory-material-containing line 80.

In one embodiment, the two-dimensional array of sidewall spacer electrodes 230 comprises a polycrystalline metallic material, and a predominant portion of grain boundaries in the polycrystalline metallic material extends along a direction within 15 degrees from a plane (such as a horizontal plane) that is normal to a sidewall(s) of the dielectric pillars 210. In one embodiment, the polycrystalline metallic material includes one of TiN, TaN, and WN. In one embodiment, each of the memory-material-containing lines 80 comprises a barrier modulated cell memory material portion (as embodied as a resistive memory material portion 86). In one embodiment, each of the memory-material-containing lines 80 further comprises a barrier material portion 82 contacting the barrier modulated cell memory material portion. In one embodiment, the barrier modulated cell memory material portion comprises a non-filamentary, electrically conductive metal oxide, and the barrier material portion 82 comprises an amorphous semiconductor material. In one embodiment, the non-filamentary, electrically conductive metal oxide comprises sub-stoichiometric titanium oxide, and the amorphous semiconductor material is selected from silicon, germanium and silicon-germanium. A predominant portion of grain boundaries in a vertical portion of the sidewall spacer electrodes extend along a direction within 15 degrees from horizontal plane located between the barrier material portion 82 and the barrier modulated cell memory material portion 86.

In one embodiment, each sidewall spacer electrode 230 within the two-dimensional array has an annular contact area with a respective memory-material-containing line 80. In one embodiment, each sidewall spacer electrode 230 within the two-dimensional array has another annular contact area with a respective first electrically conductive line 30.

In one embodiment, each memory-material-containing line 80 has a same width as a respective second electrically conductive line 90 in physical contact with the memory-material-containing line 80. In one embodiment, the resistive memory device further includes a dielectric diffusion barrier layer 188 contacting the first electrically conductive lines 30 and all outer sidewalls of the two-dimensional array of sidewall spacer electrodes 230.

In one embodiment, the resistive memory device includes a first line level dielectric layer 38 embedding the first electrically conductive lines 30, a second line level dielectric layer 98 embedding the second electrically conductive lines 90, and a via level dielectric layer 288 laterally surrounding each sidewall spacer electrode 230 within the two-dimensional array of sidewall spacer electrodes 230.

The memory cell of the embodiments of the present disclosure can be operated with lower operating current. The reduction in the operating current of the memory cell of the present disclosure can be achieved without reducing the lithographic dimensions of the patterns for pillar structures, but by employing dielectric pillars in combination with sidewall spacer electrodes as current-limiting structures. Thus, the memory device of the present disclosure require expensive lithographic patterning of ultra-narrow electrodes and the device requires lesser operational current for prior art memory devices that are formed with the same lithographic minimum dimensions. The combination of dielectric pillars and sidewall spacer electrodes can provide a small cross-sectional area for electrical current conduction when the sidewall spacer electrodes are formed as thin films. Reduction of the operating current enables size reduction of driver circuitry and other electrical components of the resistive memory device, thereby enabling scaling of the resistive memory device and more cost-effective production of the resistive memory device.

Furthermore, by having substantially horizontal grain boundaries in the vertical portion of the sidewall spacer electrode which contacts the memory-material-containing lines, can reduce the amount of oxygen traps in the sidewall spacer electrode. This can improve the device quality and provide a better ohmic contact between the electrode and the memory-material-containing-lines.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device, comprising:
a first electrode;
a sidewall spacer electrode located on a sidewall of a dielectric material contacting the first electrode;
a resistive memory cell containing a resistive memory material and contacting the sidewall spacer electrode; and
a second electrode containing the resistive memory cell, wherein:
the sidewall spacer electrode comprises a polycrystalline metallic material; and
a predominant portion of grain boundaries in a vertical portion of the polycrystalline metallic material are substantially horizontal.

2. The resistive memory device of claim 1, wherein the sidewall spacer electrode is located on a sidewall of a dielectric pillar.

3. The resistive memory device of claim 2, wherein the sidewall spacer electrode comprises a conductive tube which laterally surrounds the dielectric pillar.

4. The resistive memory device of claim 1, wherein a predominant portion of the grain boundaries in the vertical portion of the polycrystalline metallic material extend along a direction within 15 degrees from a surface normal to a sidewall of the dielectric pillar.

5. The resistive memory device of claim 1, wherein the polycrystalline metallic material comprises TiN, TaN or WN.

6. The resistive memory device of claim 2, wherein:
the sidewall spacer electrode comprises one of a two-dimensional array of sidewall spacer electrodes located on respective sidewalls of a plurality of dielectric pillars;
the first electrode comprises one of a plurality of first electrically conductive lines, each contacting a respective row of sidewall spacer electrodes;
the resistive memory cell comprises one of a plurality of memory-material-containing lines; and
the second electrode comprises one of a plurality second electrically conductive lines, each of which contacts a respective memory-material-containing line.

7. The resistive memory device of claim 6, wherein:
a first planar surface of each dielectric pillar contacts a respective first electrically conductive line;
a second planar surface of each dielectric pillar contacts a respective memory-material-containing line;
each sidewall spacer electrode within the two-dimensional array has an annular contact area with a respective memory-material-containing line; and
each sidewall spacer electrode within the two-dimensional array has another annular contact area with a respective first electrically conductive line.

8. The resistive memory device of claim 6, wherein each memory-material-containing line has a same width as a respective second electrically conductive line in physical contact with the memory-material-containing line.

9. The resistive memory device of claim 1, wherein the resistive memory material comprises a barrier modulated cell memory material portion.

10. The resistive memory device of claim 9, wherein the resistive memory device further comprises a barrier material portion contacting the barrier modulated cell memory material portion.

11. The resistive memory device of claim 10, wherein the barrier modulated cell memory material portion comprises a non-filamentary, electrically conductive metal oxide and the barrier material portion comprises an amorphous semiconductor material.

12. The resistive memory device of claim 11, wherein:
the non-filamentary, electrically conductive metal oxide comprises sub-stoichiometric titanium oxide;
the amorphous semiconductor material is selected from silicon, germanium and silicon-germanium; and
a predominant portion of grain boundaries in a vertical portion of the sidewall spacer electrode extend along a direction within 15 degrees from horizontal plane located between the barrier material portion and the barrier modulated cell memory material portion.

13. The resistive memory device of claim 1, further comprising:
a dielectric diffusion barrier layer contacting the first electrically conductive lines and all outer sidewalls of the two-dimensional array of sidewall spacer electrodes;
a first line level dielectric layer embedding the first electrically conductive lines;
a second line level dielectric layer embedding the second electrically conductive lines; and
a via level dielectric layer laterally surrounding each sidewall spacer electrode within the two-dimensional array of sidewall spacer electrodes.

14. A method of forming a resistive memory device, comprising:
forming a first electrode;
forming a dielectric pillar over the first electrode;
forming a continuous metallic material layer over the dielectric pillar;
removing an upper portion of the continuous metallic material layer located above the dielectric pillar to form a sidewall spacer electrode located on a sidewall of the dielectric pillar and in contact with the first electrode;
forming a resistive memory cell containing a resistive memory material and contacting the sidewall spacer electrode; and
forming a second electrode containing the resistive memory cell, wherein:
the sidewall spacer electrode comprises a polycrystalline metallic material; and
a predominant portion of grain boundaries in a vertical portion of the polycrystalline metallic material are substantially horizontal.

15. The method of claim 14, wherein the sidewall spacer electrode comprises a conductive tube which laterally surrounds the dielectric pillar.

16. The method of claim 14, wherein:
a predominant portion of the grain boundaries in the vertical portion of the polycrystalline metallic material extend along a direction within 15 degrees from a surface normal to a sidewall of the dielectric pillar' the polycrystalline metallic material comprises TiN, TaN or WN; and the resistive memory material comprises a barrier modulated cell memory material portion.

17. The method of claim 16, wherein:

the resistive memory device further comprises a barrier material portion contacting the barrier modulated cell memory material portion;

the barrier modulated cell memory material portion comprises a non-filamentary, electrically conductive metal oxide; and the barrier material portion comprises an amorphous semiconductor material.

18. The method of claim 17, wherein:

the non-filamentary, electrically conductive metal oxide comprises sub-stoichiometric titanium oxide;

the amorphous semiconductor material is selected from silicon, germanium and silicon-germanium; and a predominant portion of grain boundaries in a vertical portion of the sidewall spacer electrode extend along a direction within 15 degrees from horizontal plane located between the barrier material portion and the barrier modulated cell memory material portion.

19. The method of claim 14, wherein removing the upper portion of the continuous metallic material layer comprises anisotropically etching the continuous metallic material layer or performing a chemical mechanical planarization to remove the upper portion of the continuous metallic material layer.

* * * * *